United States Patent
Park et al.

(10) Patent No.: US 10,930,813 B2
(45) Date of Patent: Feb. 23, 2021

(54) SEMICONDUCTOR LIGHT-EMITTING ARRAY AND METHOD OF MANUFACTURING THE SAME

(71) Applicant: SAMSUNG ELECTRONICS CO., LTD., Suwon-si (KR)

(72) Inventors: Junghun Park, Yongin-si (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/208,901

(22) Filed: Dec. 4, 2018

(65) Prior Publication Data

US 2019/0172969 A1 Jun. 6, 2019

(30) Foreign Application Priority Data

Dec. 4, 2017 (KR) .................. 10-2017-0165231

(51) Int. Cl.
| | |
|---|---|
| *H01L 33/00* | (2010.01) |
| *H01L 33/08* | (2010.01) |
| *H01L 33/48* | (2010.01) |
| *H01L 33/32* | (2010.01) |
| *H01L 27/15* | (2006.01) |
| *H01L 33/20* | (2010.01) |

(52) U.S. Cl.
CPC .......... *H01L 33/007* (2013.01); *H01L 27/156* (2013.01); *H01L 33/08* (2013.01); *H01L 33/20* (2013.01); *H01L 33/32* (2013.01); *H01L 33/48* (2013.01)

(58) Field of Classification Search
CPC ....... H01L 33/007; H01L 33/08; H01L 33/48; H01L 33/32; H01L 27/156; H01L 33/20; H01L 33/00; H01L 27/15
USPC .......................................................... 257/88
See application file for complete search history.

(56) References Cited

U.S. PATENT DOCUMENTS

| | | | |
|---|---|---|---|
| 8,525,862 B2* | 9/2013 | Kang | ........................ B41J 2/451 347/238 |
| 8,557,632 B1* | 10/2013 | Or-Bach | ........... H01L 29/66272 438/107 |
| 2003/0053015 A1* | 3/2003 | Minoura | ................. G02B 5/124 349/113 |
| 2004/0031438 A1* | 2/2004 | Sung | ........................ H03H 3/08 117/68 |
| 2007/0200135 A1* | 8/2007 | Wang | .................. H01L 33/0079 257/103 |
| 2008/0067622 A1* | 3/2008 | Bui | ...................... H01L 27/1446 257/458 |
| 2009/0159910 A1* | 6/2009 | Lin | .......................... H01L 33/22 257/98 |

(Continued)

FOREIGN PATENT DOCUMENTS

| | | |
|---|---|---|
| JP | 2012-119516 A | 6/2012 |
| KR | 10-1157426 B1 | 6/2012 |

(Continued)

*Primary Examiner* — Alexander O Williams
(74) *Attorney, Agent, or Firm* — Sughrue Mion, PLLC (57) ABSTRACT

Provided are a semiconductor light-emitting array and a method of manufacturing the same. The manufacturing method includes forming a plurality of grooves in a region of a substrate and sequentially growing a first semiconductor layer, an active layer, and a second semiconductor layer on the substrate to form a light-emitting structure layer.

13 Claims, 10 Drawing Sheets

(56) References Cited

U.S. PATENT DOCUMENTS

| | | | |
|---|---|---|---|
| 2010/0059789 A1* | 3/2010 | Choi | H01L 21/0243 257/103 |
| 2010/0078656 A1* | 4/2010 | Seo | H01L 27/156 257/88 |
| 2010/0155699 A1* | 6/2010 | Sakong | H01L 33/02 257/14 |
| 2010/0265981 A1* | 10/2010 | Hiroyama | H01L 33/007 372/49.01 |
| 2010/0273331 A1* | 10/2010 | Chan | H01L 33/22 438/694 |
| 2011/0012155 A1* | 1/2011 | Huang | H01L 33/0095 257/98 |
| 2011/0062479 A1* | 3/2011 | Sugano | H01L 33/22 257/98 |
| 2011/0291072 A1* | 12/2011 | Kim | H01L 33/08 257/13 |
| 2012/0153257 A1* | 6/2012 | Nam | H01L 33/16 257/13 |
| 2012/0228656 A1* | 9/2012 | Kamiyama | H01L 33/10 257/98 |
| 2013/0069079 A1* | 3/2013 | Kim | C30B 29/403 257/76 |
| 2013/0089973 A1* | 4/2013 | Komada | H01L 21/02488 438/479 |
| 2013/0299796 A1* | 11/2013 | Masuyama | B81C 1/00031 257/40 |
| 2014/0175465 A1* | 6/2014 | Lee | H01L 27/15 257/88 |
| 2014/0231748 A1* | 8/2014 | Kim | H01L 33/14 257/13 |
| 2014/0353692 A1* | 12/2014 | Oh | H01L 33/385 257/88 |
| 2015/0097204 A1* | 4/2015 | Takada | B32B 38/10 257/98 |
| 2015/0171263 A1* | 6/2015 | Nakatsu | H01L 33/0025 257/13 |
| 2015/0231854 A1* | 8/2015 | Nakai | B32B 3/30 428/172 |
| 2015/0258769 A1 | 9/2015 | Farah | |
| 2015/0349197 A1* | 12/2015 | Watanabe | H01L 33/06 257/13 |
| 2015/0359056 A1* | 12/2015 | Song | H01L 33/58 315/186 |
| 2015/0362635 A1* | 12/2015 | Toriyama | G02B 3/0031 438/29 |
| 2015/0371966 A1 | 12/2015 | Yoshida et al. | |
| 2016/0028031 A1* | 1/2016 | Nakayama | H01L 51/5262 438/32 |
| 2016/0056352 A1* | 2/2016 | Koike | H01L 33/22 257/98 |
| 2016/0141528 A1* | 5/2016 | Masuyama | H01L 51/5275 257/40 |
| 2016/0240738 A1* | 8/2016 | Abe | H01L 33/16 |
| 2017/0012169 A1* | 1/2017 | Seki | H01L 33/20 |
| 2017/0123172 A1* | 5/2017 | Adachi | G02B 6/4231 |
| 2017/0288088 A1* | 10/2017 | Won Cheol | H01L 33/58 |
| 2018/0102085 A1* | 4/2018 | Pan | H01L 33/30 |
| 2018/0114800 A1* | 4/2018 | Pan | H01L 25/167 |
| 2019/0371779 A1* | 12/2019 | Yeon | H01L 24/08 |

FOREIGN PATENT DOCUMENTS

| | | |
|---|---|---|
| KR | 10-2015-0119350 A | 10/2015 |
| WO | 2015/193955 A1 | 12/2015 |

\* cited by examiner

|  | BEFORE | AFTER | VARIATION |
|---|---|---|---|
| Scribing | BOW | BOW | BOW |
| 6X7 | 39.13 | 31.52 | −7.61 |
| 6X7 | 44.86 | 24.62 | −20.23 |
| 6X7 | 31.43 | 27.78 | −3.64 |

FIG. 7

SEMICONDUCTOR LIGHT-EMITTING ARRAY AND METHOD OF MANUFACTURING THE SAME

CROSS-REFERENCE TO RELATED APPLICATION

This application claims priority from and the benefit of Korean Patent Application No. 10-2017-0165231, filed on Dec. 4, 2017, in the Korean Intellectual Property Office, the disclosure of which is incorporated herein in its entirety by reference.

BACKGROUND

1. Field

The present disclosure relates to a semiconductor light-emitting array and a method of manufacturing the same.

2. Description of the Related Art

A light-emitting diode (LED) is a device that converts electrical signals into light such as infrared or visible light by using the characteristics of a compound semiconductor. LEDs are used in home appliances, remote controllers, electric sign boards, and various automation devices. Use of LEDs in a wide range of electronic devices, from small handheld electronic devices to large display devices, has become widespread.

SUMMARY

Provided are a semiconductor light-emitting array having reduced strain and a method of manufacturing the same.

Additional aspects will be set forth in part in the description which follows and, in part, will be apparent from the description, or may be learned by practice of the presented example embodiments. According to an aspect of the disclosure, there is provided a method of manufacturing a semiconductor light-emitting array, the manufacturing method comprising: forming a plurality of grooves on a substrate; and forming a light-emitting structure layer by sequentially growing a first semiconductor layer, an active layer, and a second semiconductor layer on the substrate.

The plurality of grooves may be formed one-dimensionally or two-dimensionally.

The plurality of grooves may have point shapes and may be spaced apart from one another.

The plurality of grooves may have linear shapes and may be spaced apart from one another.

The plurality of grooves may have a mesh structure.

A thickness of the substrate may be 10 mm or less.

A depth of the grooves may be 15 μm or less.

A maximum width of the grooves may be 15 μm or less.

The plurality of grooves may be formed by a physical or a mechanical process.

The plurality of grooves may be formed by dicing or dry etching.

The method may further comprise: forming one or more grooves in one or more regions of the light-emitting structure layer corresponding to the grooves formed on the substrate.

The light-emitting structure layer may be formed by epitaxial growth.

The substrate may be a sapphire substrate.

The light-emitting structure layer may include a nitride-based semiconductor material.

According to another aspect of the disclosure, there is provide a semiconductor light-emitting array comprising: a substrate in which a plurality of grooves are formed; and a light-emitting structure layer sequentially arranged on the substrate, the light-emitting structure layer including a first semiconductor layer, an active layer, and a second semiconductor layer.

The plurality of grooves may have linear shapes and are spaced apart from one another.

The plurality of grooves may have a mesh structure.

A thickness of the substrate may be 10 mm or less.

A depth of the grooves may be 15 μm or less.

The semiconductor light-emitting array may further comprise: one or more grooves formed in one or more regions of the light-emitting structure layer corresponding to the grooves formed on the substrate.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Hereinafter, a variable laser array according to various embodiments of the present disclosure will be described in detail with reference to the accompanying drawings. Like reference numerals refer to like elements throughout. In the drawings, the sizes of constituent elements may be exaggerated for clarity. It will be understood that, although the terms first, second, etc. may be used herein to describe various elements, these elements should not be limited by these terms. These terms are used only to differentiate an element from another element.

As used herein, the singular forms "a", "an", and "the" are intended to include the plural forms as well, unless the context clearly indicates otherwise. In addition, it will be understood that when a unit is referred to as "comprising" another element, it does not preclude the possibility that one or more other elements may exist or may be added. Also, thicknesses or sizes of elements in the drawings are exaggerated for convenience and clarity of description. Furthermore, when an element is referred to as being "on" or "above" another element, it may be directly on the other element, or intervening elements may also be present. Moreover, the materials constituting each layer in the following embodiments are merely examples, and other materials may be used.

Figure 1:
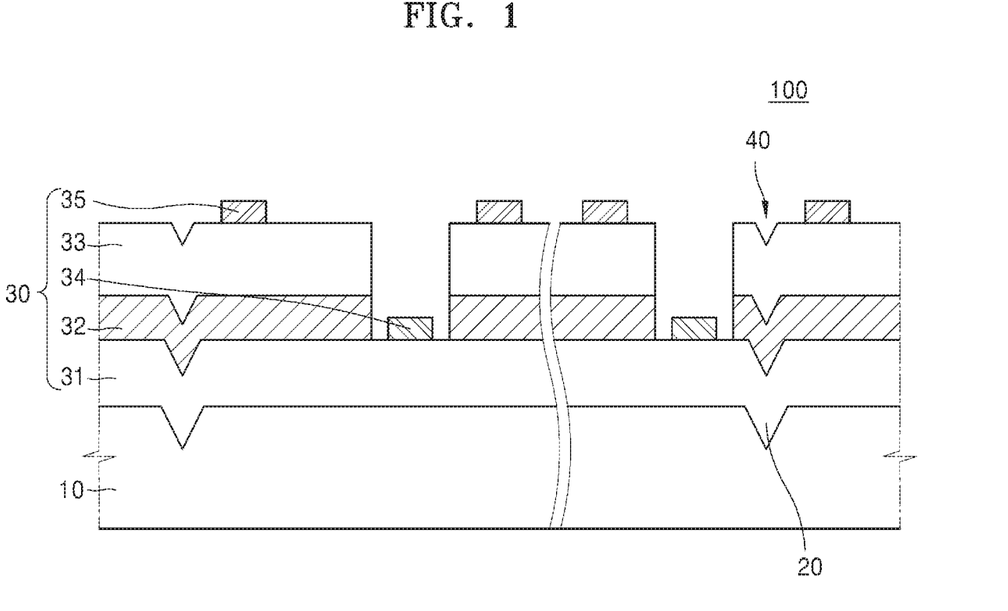
FIG. 1 is a cross-sectional view of a semiconductor light-emitting array according to an embodiment.

FIG. 1 is a cross-sectional view of a semiconductor light-emitting array 100 according to an embodiment. Referring to FIG. 1, the semiconductor light-emitting array 100 may include a substrate 10 and a light-emitting structure layer 30 on the substrate 10. A plurality of first grooves 20 may be formed in the substrate 10.

The substrate 10 may include a sapphire, silicon carbide (SiC), MgAl2O4, MgO, LiAlO2, LiGaO2, GaN, or the like. Sapphire is a hexa-rhombo R3c symmetric crystal with lattice constants of 13.001 Å and 4.758 Å in c-axis and a-axis directions, respectively. Sapphire has C (0001) plane, A (1120) plane, R (1102) plane, and the like. Since it is relatively easy to grow a nitride film in the C-plane and the C-plane is stable at high temperature, the C-plane may be mainly used as a substrate for nitride growth. A buffer layer (not shown) may include an undoped semiconductor layer made of nitride or the like and may mitigate lattice defects of a semiconductor layer grown thereon. A thickness of the substrate 10 may be as thin as about 10 mm or less.

The plurality of first grooves 20 may be formed in the surface of the substrate 10. The first grooves 20 do not pass through the entire substrate 10 such that a space is formed in a portion of the substrate 10 in a width direction. The plurality of first grooves 20 may be formed one-dimensionally or two-dimensionally. The plurality of first grooves 20 may have point shapes and be spaced apart from one another or may have linear shapes and be spaced apart from one another. The plurality of first grooves 20 may have a mesh structure in which the plurality of first grooves 20 intersect with one another.

The light-emitting structure layer 30 may include a first semiconductor layer 31, an active layer 32, and a second semiconductor layer 33 that are sequentially stacked on the substrate 10. The light-emitting structure layer 30 may be formed on a surface of the substrate 10 in which the first grooves 20 are formed. The first and second semiconductor layers 31 and 33 may include a nitride semiconductor. The first and second semiconductor layers 31 and 33 may respectively further include first and second electrodes 34 and 35 electrically connected to the first and second semiconductor layers 31 and 33. The light-emitting structure layer 30 may have second grooves 40 formed in a region corresponding to the first grooves 20.

The first and second semiconductor layers 31 and 33 may be n-type and p-type semiconductor layers, respectively, and may include a nitride semiconductor. For example, the first and second semiconductor layers 31 and 33 may have a composition formula of AlxInyGa(1−xy)N (0≤x≤1, 0≤x+y≤1), and materials such as GaN, AlGaN, and InGaN may correspond thereto. The active layer 32 formed between the first and second semiconductor layers 31 and 33 may emit light having predetermined energy by recombination of electrons and holes and may use a multiple quantum well (MQW) structure, in which quantum well layers and quantum barrier layers are alternately stacked, such as an InGaN/GaN structure. The first and second semiconductor layers 31 and 33 and the active layer 32 may be formed using a semiconductor layer growth process such as metalorganic chemical vapor deposition (MOCVD), molecular beam epitaxy (MBE), or hydride vapor phase epitaxy (HVPE).

The first and second electrodes 34 and 35 respectively electrically connected to the first and second semiconductor layers 31 and 33 may be formed on the first and second semiconductor layers 31 and 33. As shown in FIG. 1, the first electrode 34 may be formed on the first semiconductor layer 31 on which some of the second semiconductor layer 33 and the active layer 32 are etched and exposed, and the second electrode 35 may be formed on the second semiconductor layer 33. A transparent electrode such as ITO, ZnO, or the like may be further provided to improve an ohmic contact between the second semiconductor layer 33 and the second electrode 35.

Referring to FIG. 1, the first and second electrodes 34 and 35 are formed so as to face in the same direction. However, positions and connection structures of the first and second electrodes 34 and 35 may vary. In another embodiment, the first and second electrodes 34 and 35 may be formed after the first semiconductor layer 31, the active layer 32, and the second semiconductor layer 33 formed on the substrate 10 are separated for each semiconductor light-emitting device.

When a semiconductor layer is grown on a substrate, deformation may occur in the substrate such as bowing due to a difference in lattice constants between the substrate and the semiconductor layer. In more detail, a heterogeneous substrate such as sapphire used for growing a GaN thin film has a large lattice mismatch and a large thermal expansion coefficient mismatch with the GaN thin film, which causes lattice defects due to the difference in lattice constants and thermal expansion coefficient, and the substrate may bow due to the difference in thermal expansion coefficient in a semiconductor growth process performed at a high temperature. The lattice defects generated in the GaN thin film grown on the heterogeneous substrate have a great influence on the reliability of a semiconductor light-emitting array. Bowing of the substrate may cause difficulties in the progress of a subsequent process, and breakage of the substrate may cause defects of the semiconductor light-emitting array 100.

The semiconductor light-emitting array 100 according to an embodiment may form the first grooves 20 on the substrate 10 to disperse a nitride-based semiconductor material and stress due to lattice constants on the substrate 10 in multiple directions. A space created by the first grooves 20 may prevent the substrate 10 from bowing and allow many semiconductor light-emitting arrays 100 to be manufactured on one wafer.

Figure 2A:
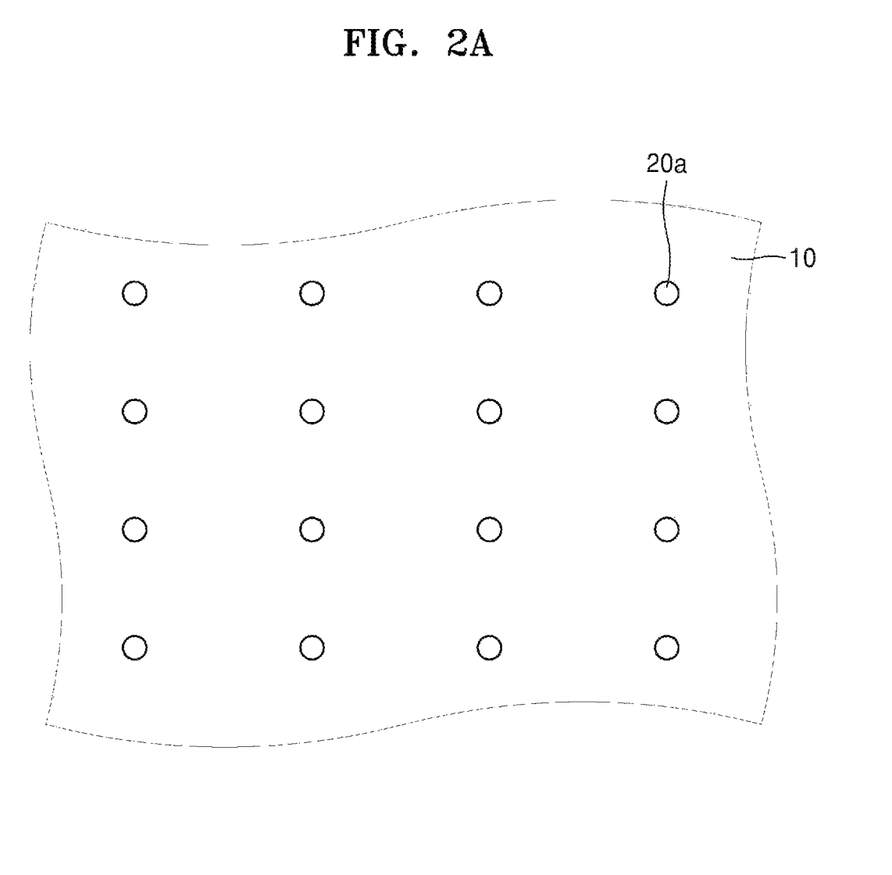
FIGS. 2A to 2C are reference views of various types of first grooves.
Figure 2B:
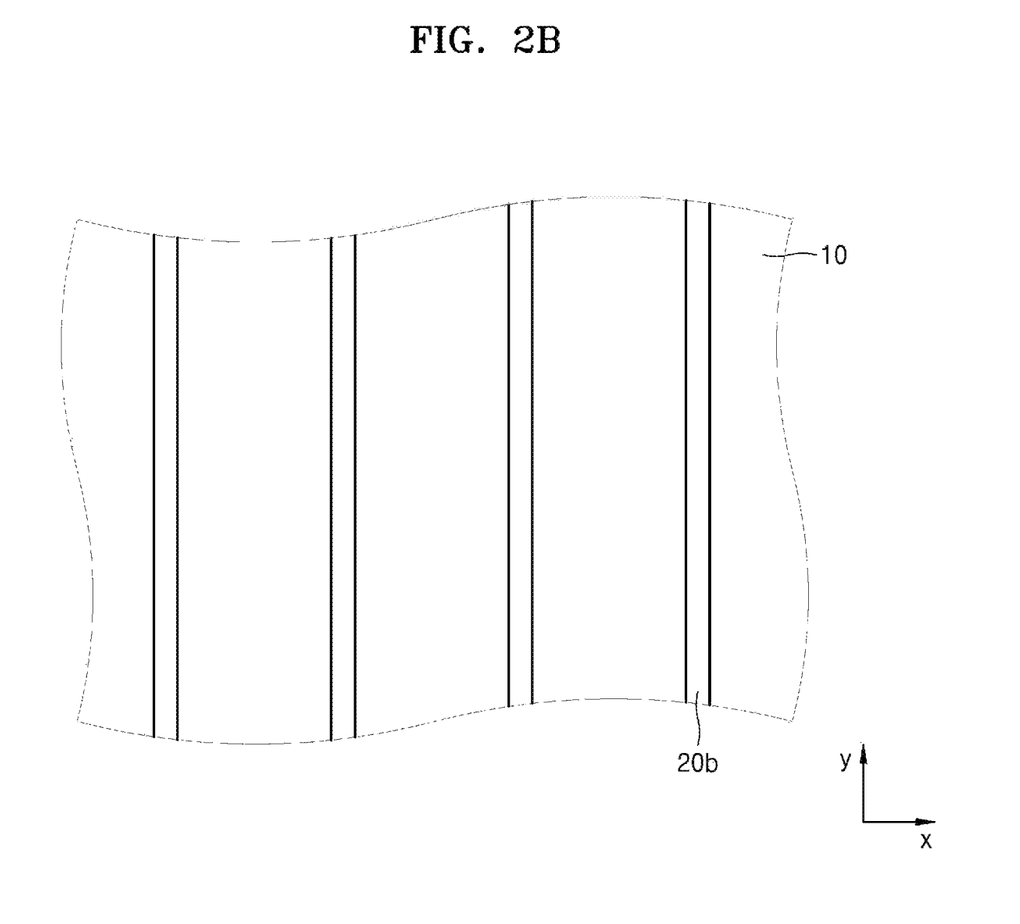
Figure 2C:
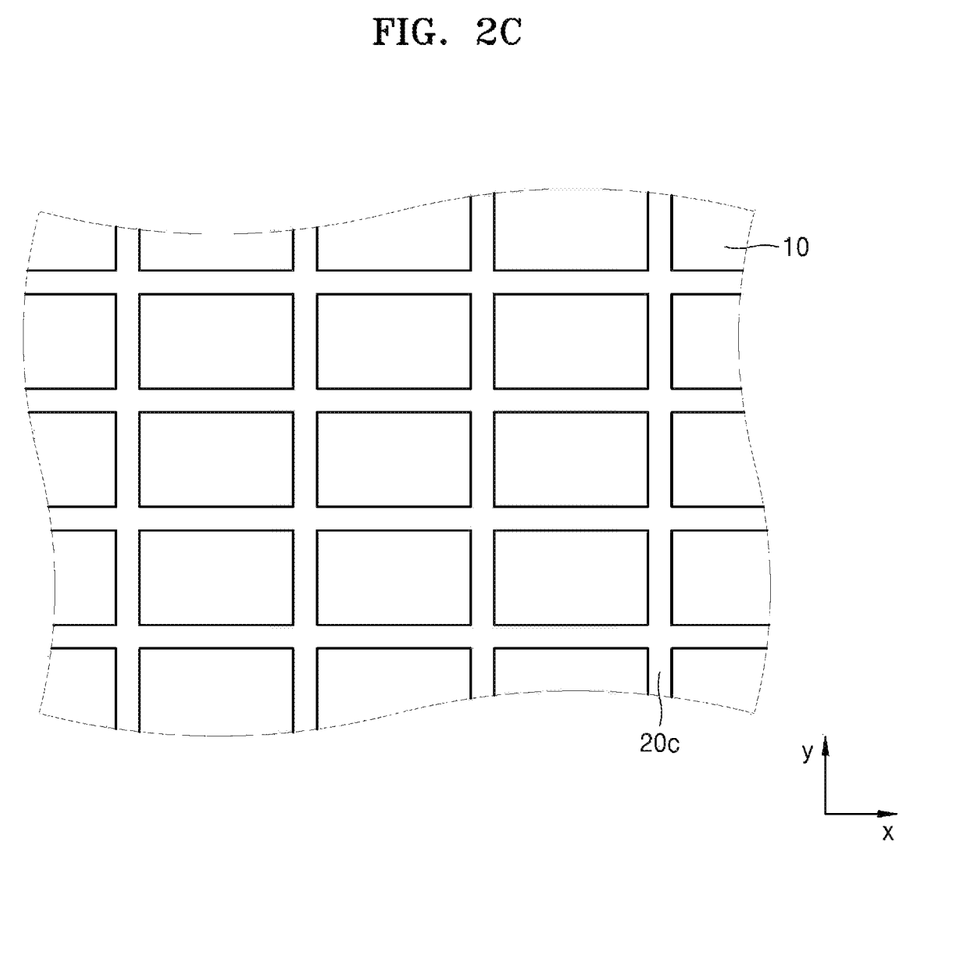

FIGS. 2A to 2C are reference views of various types of first grooves 20a, 20b, and 20c. As shown in FIG. 2A, the first grooves 20a may have point shapes. The plurality of first grooves 20a may be arranged two-dimensionally on the substrate 10 and spaced apart from one another. Even if the light-emitting structure layer is stacked on the substrate 10, the stress may be dispersed into a space formed by the first grooves 20a.

Alternatively, as shown in FIG. 2B, the first grooves 20b may have linear shapes. The first grooves 20b may be formed one-dimensionally on the substrate 10. The first grooves 20b formed long in one direction, for example, a y-axis direction may be formed one-dimensionally in an x-axis direction and spaced apart from one another.

Alternatively, as shown in FIG. 2C, the first grooves 20c may have a mesh structure. For example, the mesh structure may be formed by forming first grooves spaced apart from one another in the x-axis direction and then forming first grooves spaced apart from one another in the y-axis direction.

FIGS. 3A to 3D are reference views for explaining a method of manufacturing a plurality of semiconductor light-emitting devices.

Figure 3A:
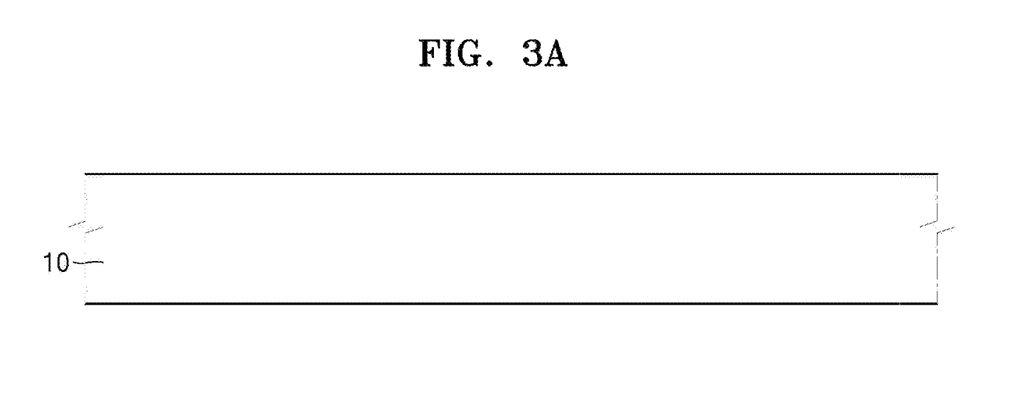
FIGS. 3A to 3D are reference views for explaining a method of manufacturing a plurality of semiconductor light-emitting devices.

As shown in FIG. 3A, the substrate 10 is provided. The substrate 10 may include a sapphire, SiC, MgAl2O4, MgO, LiAlO2, LiGaO2, GaN, or the like. A thickness of the substrate 10 may be about 10 mm or less.

Figure 3B:
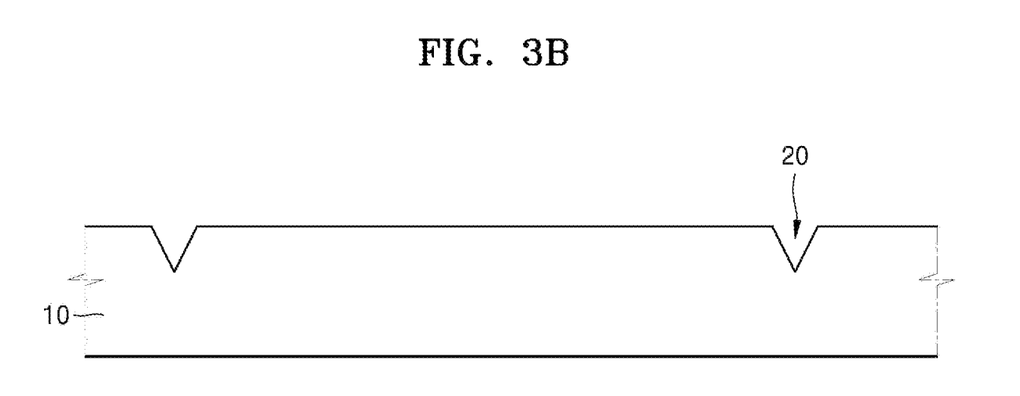

As shown in FIG. 3B, the plurality of first grooves 20 may be formed in a portion of the substrate 10. The first grooves 20 may be formed by a physical or mechanical process, for example, dicing or dry etching. However, the present disclosure is not limited thereto. A depth of the first grooves 20 may be about 15 μm or less, and the maximum width of the first grooves 20 may also be about 15 μm or less. By forming the first grooves 20 by a physical process, it is possible to prevent a component of the substrate from being changed due to a chemical process. In addition, by forming the first grooves 20 by a physical process, it is possible to prevent deformation of the substrate 10 due to heat more effectively than when the first grooves 20 are formed by laser or the like. When the first grooves 20 are formed by laser, a material change or the like of the substrate 10 may occur due to heat during laser irradiation, and a process of cooling the heat for the subsequent process may be required. However, the physical process does not generate heat and chemical deformation of the substrate 10 does not occur, and a subsequent operation, for example, growth of the first semiconductor layer 31, may be performed immediately after the first grooves 20 are formed.

Figure 3C:
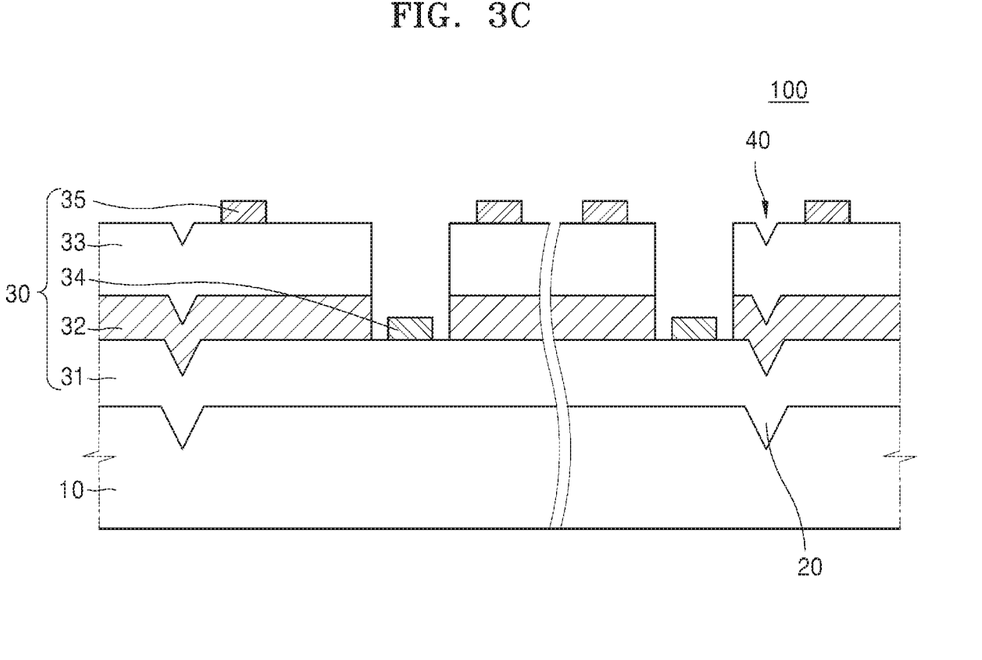

As shown in FIG. 3C, the semiconductor light-emitting array 100 may be formed by growing the light-emitting structure layer 30 on the substrate 10. The first semiconductor layer 31, the active layer 32, and the second semiconductor layer 33 may be sequentially grown. The first semiconductor layer 31, the active layer 32, and the second semiconductor may be formed using a method such as MOCVD, chemical vapor deposition (CVD), plasma enhanced chemical vapor deposition (PECVD), MBE, HVPE, or the like.

The first and second electrodes 34 and 35 may then be formed. For example, the first electrode 34 may be formed on the first semiconductor layer 31 after some of the active layer 32 and the second semiconductor layer 33 are etched, and the second electrode 35 may be formed on the second semiconductor layer 33. Semiconductor materials may be stacked together in the first grooves 20 on the substrate 10 when the light-emitting structure layer 30 grows. However, since the space formed by the first grooves 20 is maintained to a certain extent even in the process of stacking the light-emitting structure layer 30, strain due to the stacking of the light-emitting structure layer 30 may be relaxed.

Figure 3D:
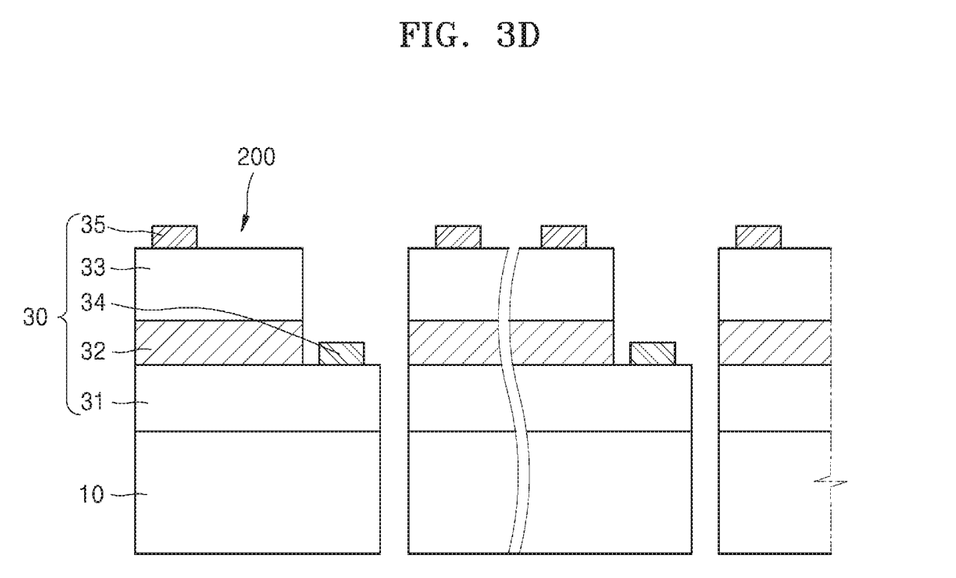

As shown in FIG. 3D, the semiconductor light-emitting array 100 may be separated in units of semiconductor light-emitting devices 200. The separated semiconductor light-emitting devices may be arranged again on a carrier substrate, for example, a substrate of a display device. A light-emitting device may be a micro LED. Here, the term "micro" may indicate the size of 1 to 100 μm, but the present disclosure is not limited thereto. The term "micro" may be applied to a light-emitting device having a size larger or smaller than that. The light-emitting device may emit light of a predetermined wavelength belonging to a wavelength range from ultraviolet light to visible light. For example, the light-emitting device may be red, green, blue, white, or UV LED.

Figure 4:
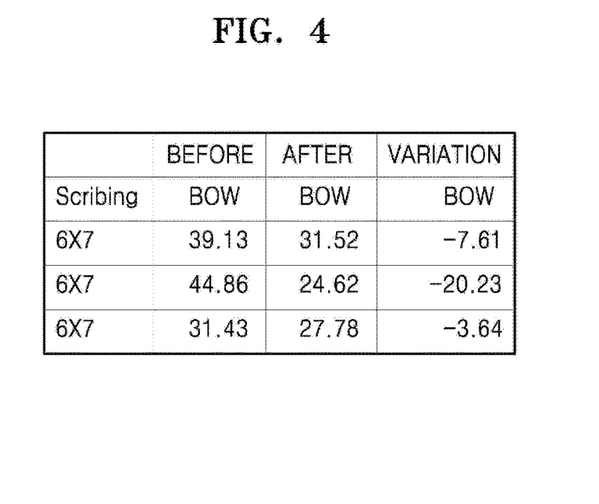
FIG. 4 is a table showing results of measuring bowing of a substrate to a semiconductor light-emitting array.

FIG. 4 is a table showing a result of measuring bowing of the substrate 10 to the semiconductor light-emitting array 100. Bowing of the substrate 10 when the light-emitting structure layer 30 is grown without forming the first grooves 20 in the substrate 10 is measured, and bowing of the substrate 10 when the light-emitting structure layer 30 is grown after the first grooves 20 are formed on the substrate 10 is measured. The first grooves 20 are formed in a mesh structure, and 6×7 light-emitting devices are formed in a unit space in the mesh structure. As shown in FIG. 4, it can be seen that the bowing of the substrate 10 in which the first grooves 20 are formed is reduced.

Figure 5:
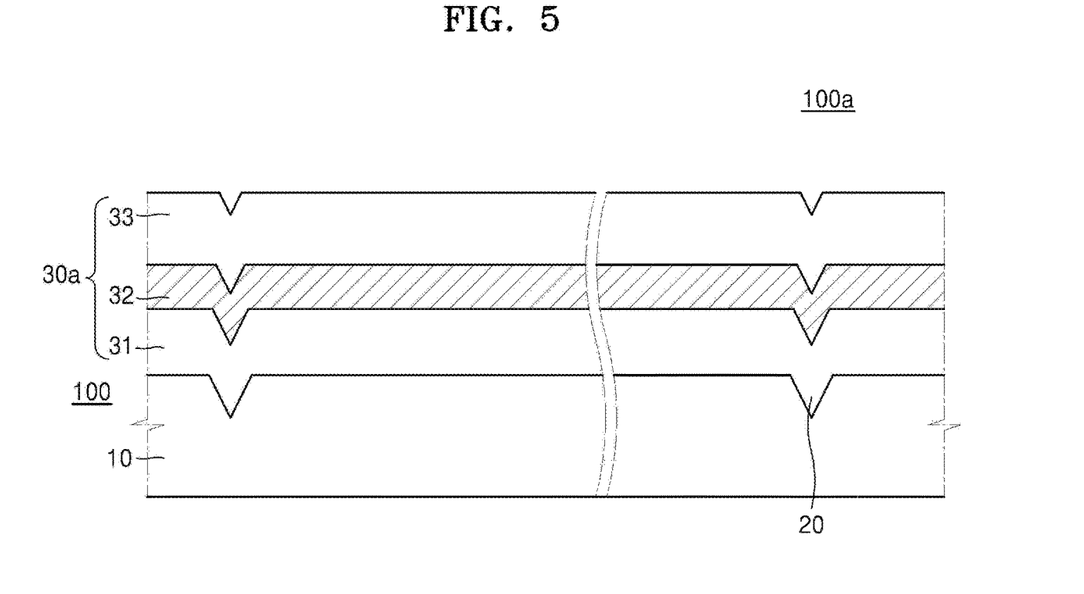
FIG. 5 is a view of a semiconductor light-emitting array according to another embodiment.

FIG. 5 is a view of a semiconductor light-emitting array 100a according to another embodiment. Comparing FIG. 1 and FIG. 5, the semiconductor light-emitting array 100a of FIG. 5 may include a light-emitting structure layer 30a including the first semiconductor layer 31, the active layer 32, and the second semiconductor layer 33. That is, after the plurality of first grooves 20 are formed on the substrate 10, the light-emitting structure layer 30a may be formed by growing the first semiconductor layer 31, the active layer 32, and the second semiconductor layer 33 on the substrate 10. Thereafter, the semiconductor light-emitting structure layer 30a of FIG. 5 may be separated in units of light-emitting diodes, and further separated from each other on a carrier substrate. Next, first and second electrodes (not shown) may be formed to complete a semiconductor light-emitting device.

Figure 6:
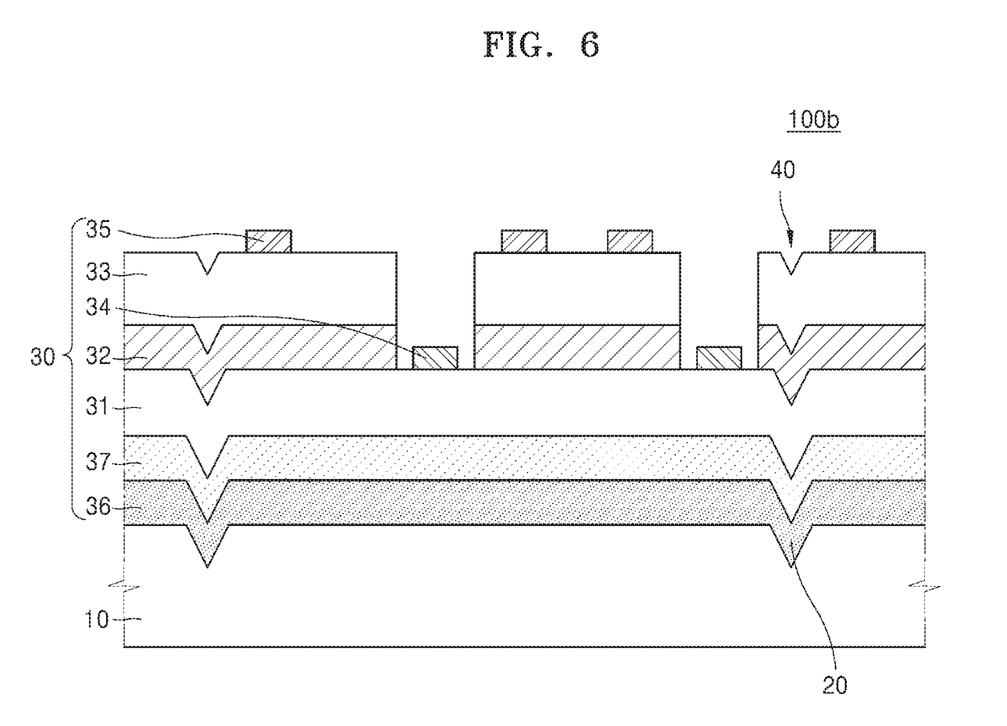
FIG. 6 is a cross-sectional view of a semiconductor light-emitting array according to another embodiment.

FIG. 6 is a cross-sectional view of a semiconductor light-emitting array 100b according to another embodiment. Comparing FIG. 1 and FIG. 6, the semiconductor light-emitting array 100b of FIG. 6 may further include an undoped GaN layer 36 and a nucleation layer 37 between the substrate 10 and the first semiconductor layer 31. The undoped GaN layer 36 and the nucleation layer 37 may serve as a buffer layer for minimizing the generation of defects and suppressing propagation of defects. The nucleation layer 37 may include AlzGawIn1−z−wN (0≤z≤1, 0≤w≤1) having a thickness of about 20 nm to about 30 nm at a low temperature of about 500° C.

FIG. 6 shows that the undoped GaN layer 36 and the nucleation layer 37 are sequentially formed between the substrate 10 and the first semiconductor layer 31, but the present disclosure is not limited thereto. Only one of the undoped GaN layer 36 and the nucleation layer 37 may be formed or the undoped GaN layer 36 may be formed on the nucleation layer 37.

Figure 7:
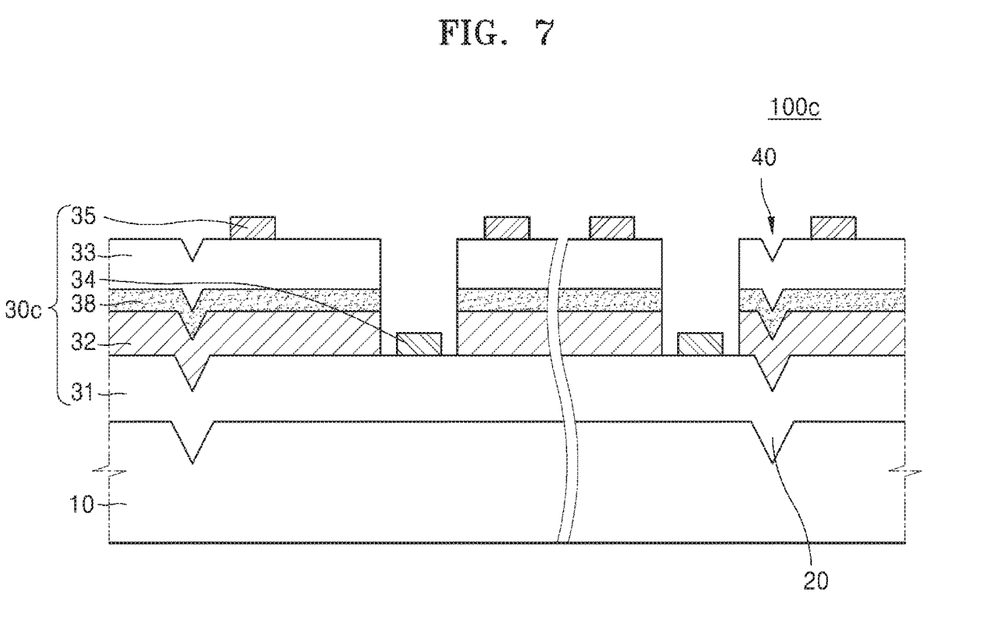
FIG. 7 is a cross-sectional view of another semiconductor light-emitting array according to another embodiment.

FIG. 7 is a cross-sectional view of another semiconductor light-emitting array 100c according to another embodiment. Comparing FIG. 1 and FIG. 7, the semiconductor light-emitting array 100c of FIG. 7 may further include an electron blocking layer 38 on the active layer 32. The electron blocking layer 38 may block electrons that have passed through the active layer 32. In the present embodiment, when the first and second semiconductor layers 31 and 33 are respectively n-type and p-type semiconductor layers, the active layer 32 emits light by recombination of electrons generated in the n-type semiconductor layer 31 and holes generated in the p-type semiconductor layer 33. Therefore, luminous efficiency increases as recombination efficiency of the electrons and holes in the active layer 32 increases. The electron blocking layer 38 is arranged on the active layer 32 to block the flow of electrons from the n-type semiconductor layer 31 through the active layer 32. Therefore, the recombination efficiency of the electrons and holes in the active layer 32 may be increased.

The electron blocking layer 38 may have a super lattice structure in which AlGaN, GaN, and InGaN are alternately stacked. The AlGaN, GaN, and InGaN constituting the electron blocking layer 38 may have different thicknesses. For example, the electron blocking layer 38 may have a structure in which AlGaN/GaN/InGaN is repeatedly stacked. A thickness of the AlGaN layer is reduced from the active layer 32 to the p-type semiconductor layer 33 and a thickness of the GaN layer and the InGaN layer increases from the active layer 32 to the p-type semiconductor layer 33. In this case, since the AlGaN layer has large band-gap energy, electrons injected from the n-type semiconductor layer 31 into the active layer 32 are prevented from passing over the active layer 32 to the p-type semiconductor layer 33, and efficiency of injecting holes into the active layer 32 is not lowered because the thickness of the AlGaN layer is reduced as the AlGaN layer is closer to the p-type semiconductor layer 33. The GaN and InGaN layers have band-gap energy less than that of the AlGaN layer so that electrons may pass over the active layer 32 to the p-type semiconductor layer 33. However, as the GaN and InGaN layers are closer to the p-type semiconductor layer 33, thicknesses thereof increase, and thus, electrons may be effectively prevented from reaching the p-type semiconductor layer 33.

Although the above-described semiconductor light-emitting arrays 100, 100a, 100b, and 100c have been described with reference to the embodiments shown in the drawings, they are only examples. It should be understood that example embodiments described herein should be considered in a descriptive sense only and not for purposes of limitation. While one or more example embodiments have been described with reference to the figures, it will be understood by those of ordinary skill in the art that various changes in form and details may be made therein without departing from the spirit and scope as defined by the following claims.

What is claimed is:

1. A method of manufacturing a semiconductor light-emitting array, the manufacturing method comprising:
   forming a plurality of first grooves on an upper surface of a substrate by a physical or a mechanical process; and
   forming a light-emitting structure layer by sequentially growing a first semiconductor layer, an active layer, and a second semiconductor layer on the substrate;
   forming a plurality of first electrodes respectively electrically connected to the first semiconductor layer and a plurality of second electrodes respectively electrically connected to the second semiconductor layer;
   separating the light-emitting structure layer, the plurality of first electrodes and the plurality of second electrodes into units of semiconductor light-emitting device,
   wherein each of the upper surfaces of the first semiconductor layer, the active layer, and the second semiconductor layer comprises a plurality of second grooves corresponding to the plurality of first grooves and overlapping the plurality of first grooves in a one-to-one manner in a plan view, and
   the plurality of first and second grooves do not overlap with the plurality of first and second electrodes in the plan view.

2. The method of claim 1, wherein the plurality of first grooves are formed one-dimensionally or two-dimensionally.

3. The method of claim 1, wherein the plurality of first grooves have point shapes and are spaced apart from one another.

4. The method of claim 1, wherein the plurality of first grooves have linear shapes and are spaced apart from one another.

5. The method of claim 1, wherein the plurality of first grooves have a mesh structure.

6. The method of claim 1, wherein a thickness of the substrate is 10 mm or less.

7. The method of claim 1, wherein a depth of the first grooves is 15 μm or less.

8. The method of claim 1, wherein a maximum width of the first grooves is 15 μm or less.

9. The method of claim 1, wherein the plurality of first grooves are formed by dicing or dry etching.

10. The method of claim 1, wherein the light-emitting structure layer is formed by epitaxial growth.

11. The method of claim 1, wherein the substrate is a sapphire substrate.

12. The method of claim 1, wherein the light-emitting structure layer includes a nitride-based semiconductor material.

13. The method of claim 1, wherein a non-grooved portion of at least one of the first semiconductor layer, the active layer, or the second semiconductor layer overlaps a non-grooved portion of the substrate in the plan view.

* * * * *